United States Patent [19]

Nagoya

[11] Patent Number: 5,172,188
[45] Date of Patent: Dec. 15, 1992

[54] PATTERN SHIFT MEASURING METHOD
[75] Inventor: Takatoshi Nagoya, Annaka, Japan
[73] Assignee: Shin-Etsu Handotai Co., Ltd., Tokyo, Japan
[21] Appl. No.: 797,842
[22] Filed: Nov. 26, 1991

[30] Foreign Application Priority Data

Nov. 30, 1990 [JP] Japan .................................. 2-338864

[51] Int. Cl.⁵ ............................................ G01B 11/00
[52] U.S. Cl. .................................................... 356/373
[58] Field of Search ................................. 356/372, 373

[56] References Cited

PUBLICATIONS

Japanese Abstract 61-251123, vol. 11, No. 99, publication date: Mar. 27, 1987.
Japanese Abstract 61-251124, vol. 11, No. 99, publication date: Mar. 27, 1987.
Japanese Abstract 63-204105, vol. 12, No. 492, publication date: Dec. 22, 1988.
Japanese Abstract 63-301541, vol. 13, No. 139, publication date: Apr. 6, 1989.
Japanese Abstract 01-31413, vol. 13, No. 220, publication date: May 23, 1989.
Japanese Abstract 01-31414, vol. 13, No. 220, publication date: May 23, 1989.
Japanese Abstract 02-152250, vol. 14, No. 408, publication date: Sep. 4, 1990.
Japanese Abstract 03-44056, vol. 15, No. 183, publication date: May 10, 1991.
Patent Abstracts of Japan, vol. 012, No. 239 (E-630) 8 Feb. 1988, & JP-A-63-029 943 (NEC Corp.).
Patent Abstracts of Japan, vol. 014, No. 380 (E-0965) 25 May 1990, & JP-A-01 137 348 (NEC Corp.).

*Primary Examiner*—F. L. Evans
*Attorney, Agent, or Firm*—Nikaido, Marmelstein, Murray & Oram

[57] ABSTRACT

A method of measuring pattern shift of a semiconductor wafer with a high accuracy in a short period of time is disclosed, wherein a pattern composed of a groove or a ridge is formed on the semiconductor wafer, then at least one oxide film layer extending over and across the pattern is formed, subsequently, after an epitaxial growing process is performed to form an epitaxial layer over the semiconductor wafer, the lateral position of the pattern is measured both on the epitaxial layer and on the oxide film layer, and after that the position of the pattern measured at the epitaxial layer is compared with the lateral position of the pattern measured at the oxide film layer, thereby determining a displacement of the pattern.

5 Claims, 1 Drawing Sheet

PATTERN SHIFT MEASURING METHOD

BACKGROUND OF THE INVENTION

1. Field of the Invention:

The present invention relates to a method of measuring the pattern shift occurred in epitaxial growth on a semiconductor wafer with patterns thereon and more particularly to a method of measuring the pattern shift with a high accuracy in a short period of time.

2. Description of the Prior Art:

It is essential to control the shift of a buried diffusion pattern after the growth of an epitaxial layer in a bipolar transistor in an IC. For this purpose, the growth conditions (such as reaction temperature and reaction speed) should be always controlled to assure constant pattern shift. However, it is very difficult to control the growth conditions strictly enough to meet the requirements because frequent measurement of the pattern shift is inevitable.

Conventionally, the angular lapping and stain method is used for this purpose. This method comprises: (1) slicing chips as samples having a buried layer in parallel to and perpendicular to the orientation flat by using a dicing saw; (2) angular polishing of the new narrow surfaces created as sections of the sliced chips; (3) etching the polished surfaces (Sirtl, 2 to 3 seconds); and (4) measuring the shift of the patterns of the buried layers by using a differential, interference microscope.

The pattern shift factor is obtained by the following equation:

the pattern shift factor = the amount of shift ($\mu$m)/the thickness of the epitaxial layer ($\mu$m)

However, since it takes more than three hours to measure the pattern shift, this conventional method cannot be used so frequently and is rather expensive.

SUMMARY OF THE INVENTION

With the foregoing drawbacks of the prior art in view, it is an object of this invention to provide a method which is capable of measuring the pattern shift of a semiconductor wafer in a short period of time with utmost ease, with a high accuracy and at a low cost.

According to this invention, there is provided a method of measuring pattern shift of a semiconductor wafer which is depicted with linear steps thereon: forming a pattern composed of a groove or a ridge on the semiconductor wafer; forming at least one strip of oxide film layer extending over and across the pattern; thereafter, performing an epitaxial growing process to form an epitaxial layer over the semiconductor wafer; measuring the position of the pattern both on the surface of the epitaxial layer and on the oxide film layer; and comparing a measurement of the lateral position of the pattern on the epitaxial layer with a measurement of the lateral position of the pattern on the oxide film layer in the direction perpendicular to the patterns so as to determine a displacement of the stepped pattern.

Preferably, the number of the oxide film layer strips is plural, and the pattern and the plural oxide film layer strips jointly form a lattice-like pattern.

The displacement of the pattern, namely the pattern shift PS is determined according to the following equation:

$$PS = \{(L+R)/2\}/T$$

where L is the displacement of the pattern measured at one edge thereof, R is the displacement of the pattern measured at an opposite edge thereof, and T is the thickness of the epitaxial layer.

Many other objects, advantages and features of the present invention will be better understood from the following description taken in conjunction with the accompanying drawing.

DETAILED DESCRIPTION OF THE INVENTION

Figure 1:
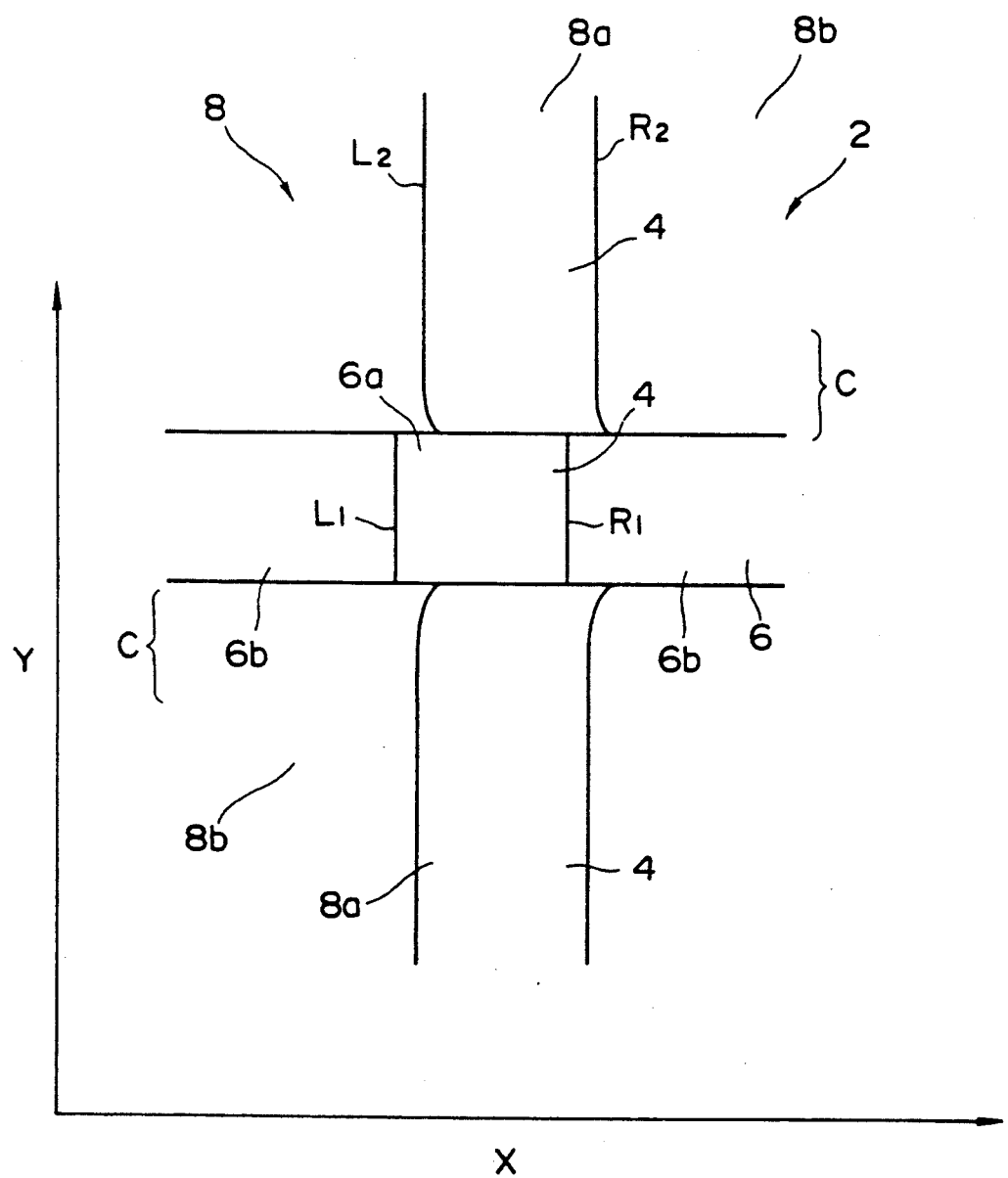
FIG. 1 is a diagrammatical view illustrative of the principle of a method of this invention for measuring the pattern shift of an epitaxial layer on a semiconductor wafer.

A method of this invention for measuring pattern shift on a semiconductor wafer will be described below in greater detail with reference to the accompanying drawing.

FIG. 1 diagrammatically shows the principle of the pattern shift measuring method of this invention. In FIG. 1, numeral 2 is a semiconductor wafer having a buried diffusion layer of antimony (Sb) which is formed with a pattern 4 delineated as a groove or a ridge. After an oxide film of the semiconductor wafer 2 (hereinafter referred to as "buried diffusion wafer") is removed by hydrofluoric acid, the buried diffusion wafer 2 is oxidized so as to form an oxide film having a thickness not less than 2000 Å. The oxide film thus formed is selectively removed by photolithography using a desired mask pattern in such a manner that one strip or more of masking oxide film layers 6 (only one strip shown in FIG. 1) are formed over and across the pattern 4. Preferably, the strips of the oxide film layers 6 and the pattern 4 cross at right angles to one another so as to form a lattice-like pattern. The oxide film layers 6 preferably have a width in the range of from about 50 to about 200 $\mu$m. An excessively wide oxide film layer brings about undesirable growth of polysilicon. The buried diffusion wafer 2 partly covered with the masking oxide film layers 6 is then subjected to an epitaxial growing process so as to form an epitaxial layer only on the buried diffusion wafer 2. The pattern used herein is advantageous for a subsequent measurement of pattern shift because the masking oxide film layers are in tight contact with a surface of the semiconductor wafer and hence deposition of silicon comes out up to side edges of the masking oxide film layers.

The epitaxial growth does not appear at a portion of the buried diffusion wafer (semiconductor wafer) 2 which is covered with the masking oxide film layers 6. The epitaxial growth appears at a portion of the buried diffusion wafer (semiconductor wafer) 2 devoid of the masking oxide film layers 6. With the epitaxial growing process of this nature, an epitaxial layer 8 shown in FIG. 1 is formed. As shown in FIG. 1, the epitaxial layer 8 includes a portion 8a overlying the Sb-diffusion layer and a portion 8b overlying a layer free from Sb diffusion (non-Sb-diffusion layer). The Sb-diffusion layer portion 8a represents a pattern which is displaced or shifted in lateral position relative to the original pattern 4 on the buried diffusion wafer. Likewise, the masking oxide film layer 6 includes an Sb-diffusion layer portion 6a (stated in other words, a portion of the pattern 4 which is free from displacement or shift) and a non-Sb-diffusion layer portion 6b.

Reference characters $L_1$, $L_2$ and $R_1$, $R_2$ denote left and right boundaries between the diffusion layer and the non-diffusion area. Reference character C denotes a crown formed in the epitaxial deposition process at a boundary portion between the oxide film layer and the silicon substrate. The crown C is formed in a region extending along the oxide film layer 6 and having a width of from 300 to 400 μm, so that an accurate measurement of the pattern shift is not possible in this region.

Positions of the respective boundaries $L_1$, $L_2$ and $R_1$, $R_2$ are measured in the manner described below. Any measuring means or system may be used for this purpose as long as it is able to detect the position of boundaries. Among others, a line width measuring instrument such as an auto-telecomparator is preferable. The boundary position measurement is performed, as follows:

(1) detecting the position of the left side boundary $L^1$ between the diffusion layer and the non-diffusion layer which underlie the oxide film layer 6, and storing the detected boundary position;

(2) moving a stage on which a specimen is mounted, in the Y axis direction by a predetermined distance (500 μm, for example) so as to avoid influence of the crown C on the measurement, and thereafter detecting the position of the left side boundary L 2 between the diffusion layer and the non-diffusion layer which underlie the epitaxial growth layer 8, and storing the detected boundary position;

(3) calculating the distance L between the boundary $L_1$ and the boundary $L_2$ by using the equation $L=L_1-L_2$;

(4) moving the stage in the X axis direction by a predetermined distance (80 μm, for example), after that detecting the position between the right side boundary $R_1$ between the diffusion layer and the non-diffusion layer which underlie the oxide film layer 6, and storing the detected boundary position;

(5) moving the stage in the Y axis direction by a predetermined distance (500 μm, for example) so as to avoid influence of the crown C on the measurement, and thereafter detecting the position of the right side boundary $R_2$ between the diffusion layer and the non-diffusion layer which underlie the epitaxial growth layer 8, and storing the detected boundary position; and (6) calculating the distance R between the boundary $R_1$ and the boundary $R_2$ by using the equation $R=R_1-R_2$.

The displacement of the pattern, namely the pattern shift PS can be calculated by the following equation (I):

$$PS=\{(L+R)/2\}/T \qquad (I)$$

where L is the displacement of said pattern measured at one edge thereof (the left edge in the illustrated embodiment), R is the displacement of said pattern measured at an opposite edge thereof (the right edge in the illustrated embodiment), and T is the thickness of the epitaxial growth layer.

The pattern shift measurement was performed under the following conditions.

1) Specimens
CZ p-type semiconductor wafer: <111> off-angle 3° 30' in<112> 100 φ, 10-200 Ωcm, OF<110>
Buried diffusion layer: Sb, 15 Ω/□, depth 8 mm
Width of the buried diffusion layer: 80 μm 2) Photolithography
The oxide film on a substrate was removed by buffered hydrofluoric acid, and after that an oxide film of 6000 Å in thickness was formed by thermal oxidation process. Subsequently, a raised lattice-like oxide film pattern having a line with of 50 μm and a line pitch of 5 mm was formed by a known photolithography.

3) Epitaxial growth
10 μm, 1.6 Ωcm
Reaction furnace used: Cylindrical furnace
Reaction temperature: 1150° C.
Reaction rate: 0.30 μm/min
Reaction pressure: 760 Torr 4) Measurement
By using an auto-telecomparator (an instrument for measurement of minimal length), positions of the respective boundaries were measured in the same procedure as described above (at that time, the stage was moved by a distance same as the distance as exemplarily specified above).

The same position was measured thirty (30) times with the results described as follows.

Thickness of epitaxial layer (T): 10.02 μm
Mean value of $L_1$: 60.54
Mean value of $L_2$: 62.67
Mean value of L: 2.13
Mean value of $R_1$: 61.37
Mean value of $R_2$: 63.61
Mean value of R: 2.29
Mean value of pattern shift: 0.22
Standard deviation of pattern shift: 0.005

For comparative purposes, by using semiconductor wafers fabricated by the same procedure as described above, pattern shift was measured by a conventional measuring method (angular lapping and stain method). The results indicated that a mean value of pattern shift was substantially the same as that taken by the measurement of this invention but a standard deviation of pattern shift was 0.102.

As evidenced from the foregoing results, the measurement according to this invention can measure pattern shift with an accuracy which is about twenty (20) times the accuracy of the conventional measuring method.

In the embodiment described above, the buried diffusion layer is antimony (Sb). The method of this invention is also applicable to buried diffusion layers of other impurities such as boron (B), phosphorous (P) and arsenic (As). In addition, the pattern formed on a surface of the semiconductor wafer in the form of a groove or a ridge may be formed only by oxidation without following diffusion with impurities.

As described above, according to the method of this invention, it is possible to measure the pattern shift of the epitaxial layer on a semiconductor wafer in a short period of time, with a high accuracy and at a low cost.

What is claimed is:

1. A method of measuring pattern shift of a semiconductor wafer, comprising the steps of:
   forming a pattern composed of a groove or a ridge on the semiconductor wafer;
   forming at least one strip of oxide film layer extending over and across said pattern;
   thereafter, performing an epitaxial growing process to form an epitaxial layer over said semiconductor wafer;

measuring the lateral position of said pattern both on said epitaxial layer and on said oxide film layer; and comparing the lateral position of said pattern measured on said epitaxial layer with the position of said pattern measured on said oxide film layer so as to determine a displacement of said pattern.

2. A method according to claim 1, wherein pattern shift PS of said pattern is determined according to the following equation:

$$PS = \{(L+R)/2\}/T$$

where L is the displacement of said pattern measured at one edge thereof, R is the displacement of said pattern measured at an opposite edge thereof, and T is the thickness of said epitaxial layer.

3. A method according to claim 1, wherein said pattern and said at least one oxide film layer cross at right angles to one another.

4. A method according to claim 3, wherein the number of said oxide film layer is plural, said pattern and plurality of said oxide film layer strips jointly forming a lattice-like pattern.

5. A method according to claim 1, wherein said oxide film layer has a width in the range of from about 50 to about 200 μm.

* * * * *